United States Patent
Kato et al.

(10) Patent No.: US 10,410,982 B2
(45) Date of Patent: Sep. 10, 2019

(54) RESIN MOLDED BODY WITH RFIC PACKAGE INCORPORATED THEREIN AND METHOD FOR MANUFACTURING SAME

(71) Applicant: Murata Manufacturing Co., Ltd., Nagaokakyo-shi, Kyoto-fu (JP)

(72) Inventors: Noboru Kato, Nagaokakyo (JP); Hiroyuki Imanishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/355,182

(22) Filed: Nov. 18, 2016

(65) Prior Publication Data

US 2017/0069585 A1 Mar. 9, 2017

Related U.S. Application Data

(63) Continuation of application No. PCT/JP2015/062352, filed on Apr. 23, 2015.

(30) Foreign Application Priority Data

Jun. 6, 2014 (JP) .................................. 2014-117311

(51) Int. Cl.
*H01L 23/66* (2006.01)
*H01L 25/00* (2006.01)
*H01Q 7/00* (2006.01)
*H01L 23/373* (2006.01)
(Continued)

(52) U.S. Cl.
CPC ........ *H01L 23/66* (2013.01); *G06K 19/07745* (2013.01); *G06K 19/07749* (2013.01); *G06K 19/07754* (2013.01); *G06K 19/07773* (2013.01); *G06K 19/07784* (2013.01); *H01L 23/3731* (2013.01); *H01L 25/00* (2013.01); *H01Q 7/00* (2013.01); *H01L 2223/6677* (2013.01);
(Continued)

(58) Field of Classification Search
None
See application file for complete search history.

(56) References Cited

U.S. PATENT DOCUMENTS

2007/0164414 A1 7/2007 Dokai et al.
2012/0206239 A1* 8/2012 Ikemoto ............. G06K 7/10346
340/10.1

FOREIGN PATENT DOCUMENTS

JP 08-120031 A 5/1996
JP 2000-311226 A 11/2000
JP 2000311226 A * 11/2000
(Continued)

OTHER PUBLICATIONS

Official Communication issued in corresponding International Application PCT/JP2015/062352, dated Jun. 2, 2015.

*Primary Examiner* — Ermias T Woldegeorgis
(74) *Attorney, Agent, or Firm* — Keating & Bennett, LLP

(57) ABSTRACT

A resin molded body with an RFIC package incorporated therein is insert-molded incorporating therein a metal core material and an RFIC element connected to the metal core material. The RFIC element includes a ceramic multi-layer substrate that incorporates therein a coil conductor, and an RFIC chip mounted on a mounting surface of the multi-layer substrate. The RFIC chip is connected to the coil conductor by nano-particle bonding or ultrasonic bonding. The coil conductor is coupled with the core material in a magnetic field coupling scheme.

17 Claims, 15 Drawing Sheets

(51) Int. Cl.
*G06K 19/077* (2006.01)
*H01Q 1/22* (2006.01)

(52) U.S. Cl.
CPC ............... *H01L 2224/16227* (2013.01); *H01L 2924/0002* (2013.01); *H01Q 1/2225* (2013.01)

(56) References Cited

FOREIGN PATENT DOCUMENTS

| | | |
|---|---|---|
| JP | 2008-148345 A | 6/2008 |
| JP | 2009-157870 A | 7/2009 |
| JP | 2012-137895 A | 7/2012 |

\* cited by examiner

RESIN MOLDED BODY WITH RFIC PACKAGE INCORPORATED THEREIN AND METHOD FOR MANUFACTURING SAME

CROSS REFERENCE TO RELATED APPLICATIONS

This application claims the benefit of priority to Japanese Patent Application No. 2014-117311 filed on Jun. 6, 2014 and is a Continuation Application of PCT/JP2015/062352 filed on Apr. 23, 2015. The entire contents of each application are hereby incorporated herein by reference.

BACKGROUND OF THE INVENTION

1. Field of the Invention

The present invention relates to a resin molded body with a radio frequency integration circuit (RFIC) package incorporated therein and, more particularly, to a resin molded body with an RFIC package incorporated therein formed by insert-molding a metal core material and an RFIC package connected to the metal core material.

The present invention also relates to a manufacturing method for manufacturing the resin molded body with an RFIC package incorporated therein.

2. Description of the Related Art

An acrylonitrile butadiene styrene copolymer (an ABS-based resin) is widely used as a constituent member of a toy and the like because the ABS-based resin has high mechanical strength and also has excellent surface gloss. For example, as disclosed in JP 8-120031 A, however, the temperature during the molding needs to be a high temperature (that is, for example, equal to or higher than 200° C.) to acquire an ABS-based resin molded body that has excellent surface gloss.

On the other hand, an attempt has been made to impart a radio frequency identification (RFID) function to a toy by burying an RFID tag in a constituent member of the toy or the like. An RFID tag is generally a tag formed by mounting an RFIC chip on a base material that includes an antenna, through a conductive bonding material such as Sn-based solder. It is therefore difficult to incorporate the ordinary RFID tag in a molded body of a resin that needs a high molding temperature as the ABS-based resin does. This is because the Sn-based solder used to mount the RFIC chip on the base material may be melted during the molding.

To connect the antenna and the RFIC chip to each other, a bonding material that has high heat resistance such as an Au bump, physical contact between metals each having heat resistance, or the like, can be used. During the insert-molding, however, not only the heat but also the pressure from the flowing resin are applied to the connection portion, and wire breakage therefore tends to also occur in the connection portion. Especially, when the size of the antenna is increased to improve the communication property, wire breakage tends to occur in the connection portion between the antenna and the RFIC chip due to the temperature and the flow pressure of the resin.

SUMMARY OF THE INVENTION

Preferred embodiments of the present invention provide a resin molded body with an RFIC package incorporated therein capable of improving the communication property maintaining the reliability of the connection between an antenna and the RFIC chip, and a manufacturing method for manufacturing the resin molded body.

A resin molded body with an RFIC package incorporated therein according to a preferred embodiment of the present invention is a resin molded body with an RFIC package incorporated therein that includes a resin molded body that is insert-molded, a metal core material that is incorporated in the resin molded body, and the RFIC package that is incorporated in the resin molded body and that is connected to the core material. The RFIC package includes a heat-resistant substrate that incorporates therein a coil conductor, and the RFIC chip disposed on the heat-resistant substrate. The coil conductor is connected to the core material through magnetic-field coupling.

Preferably, the RFIC chip is mounted on the surface of the heat-resistant substrate by Ag nano-particle bonding or Au ultrasonic bonding, to be connected to the coil conductor.

Further preferably, the RFIC chip includes a first input and output terminal, and a second input and output terminal, and at least surfaces of the first and second input and output terminals include a metal material including Au as the main component thereof. First and second ends of the coil conductor are connected to a first terminal electrode and a second terminal electrode that are disposed on a mounting surface of the heat-resistant substrate. At least surfaces of the first and second ends include a metal material including Au as a main component thereof. The first input and output terminal and the second input and output terminal are respectively connected to the first terminal electrode and the second terminal electrode by the Ag nano-particle bonding or the Au ultrasonic bonding.

Preferably, the resin molded body is an ABS-based resin and the insert-molding is executed at a temperature equal to or higher than about 200° C., for example.

Preferably, the RFIC package includes a sealing resin that seals the RFIC chip.

Preferably, the core material includes a small diameter loop portion having a C-shape or a substantial C-shape, in a portion thereof, and the coil conductor is connected to the small diameter loop portion through the magnetic-field coupling.

Further preferably, the core material further includes first extension portions that extend from the ends of the small diameter loop portion to be in proximity to each other and to be in parallel or substantially in parallel to each other.

More preferably, the resin molded body preferably defines a doll and the first extension portions are disposed in a vicinity of, or adjacent to, a head portion of the doll.

Preferably, the core material further includes a first body framework portion that has one end connected to one end of the small diameter loop portion, a second body framework portion that has one end connected to the other end of the small diameter loop portion, and second extension portions that extend from the other end of the first body framework portion and the other end of the second body framework portion to be in proximity to each other and to be in parallel or substantially in parallel to each other.

Further preferably, the second extension portions, together with the small diameter loop portion, the first body framework portion, and the second body framework portion, define a resonance circuit, and a resonance frequency of the resonance circuit is matched with a frequency band of a high frequency signal output from the RFIC chip.

A manufacturing method of a resin molded body with an RFIC package incorporated therein according to a preferred embodiment of the present invention includes a processing step of processing the metal core material, an attaching step of attaching the RFIC package that includes the heat-resistant substrate incorporating therein the coil conductor, and the RFIC chip disposed on the heat-resistant substrate, to the core material such that the coil conductor is connected to the core material through magnetic-field coupling, and a production step of producing the resin molded body that incorporates therein the core material and at least a portion of the RFIC package, by insert-molding.

The insert-molding is executed at a high temperature and the resin flows for the molding while the coil conductor connected to the RFIC chip is incorporated in the heat-resistant substrate and the coil conductor is coupled with the core material through a magnetic field. The insert-molded metal core material is thus able to be used as the radiating element and the communication property, such as extension of the communication distance, is thus improved. The reliability of the connection between the coil conductor and the core material is able to be maintained even at the high temperature and even with the flowing resin.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
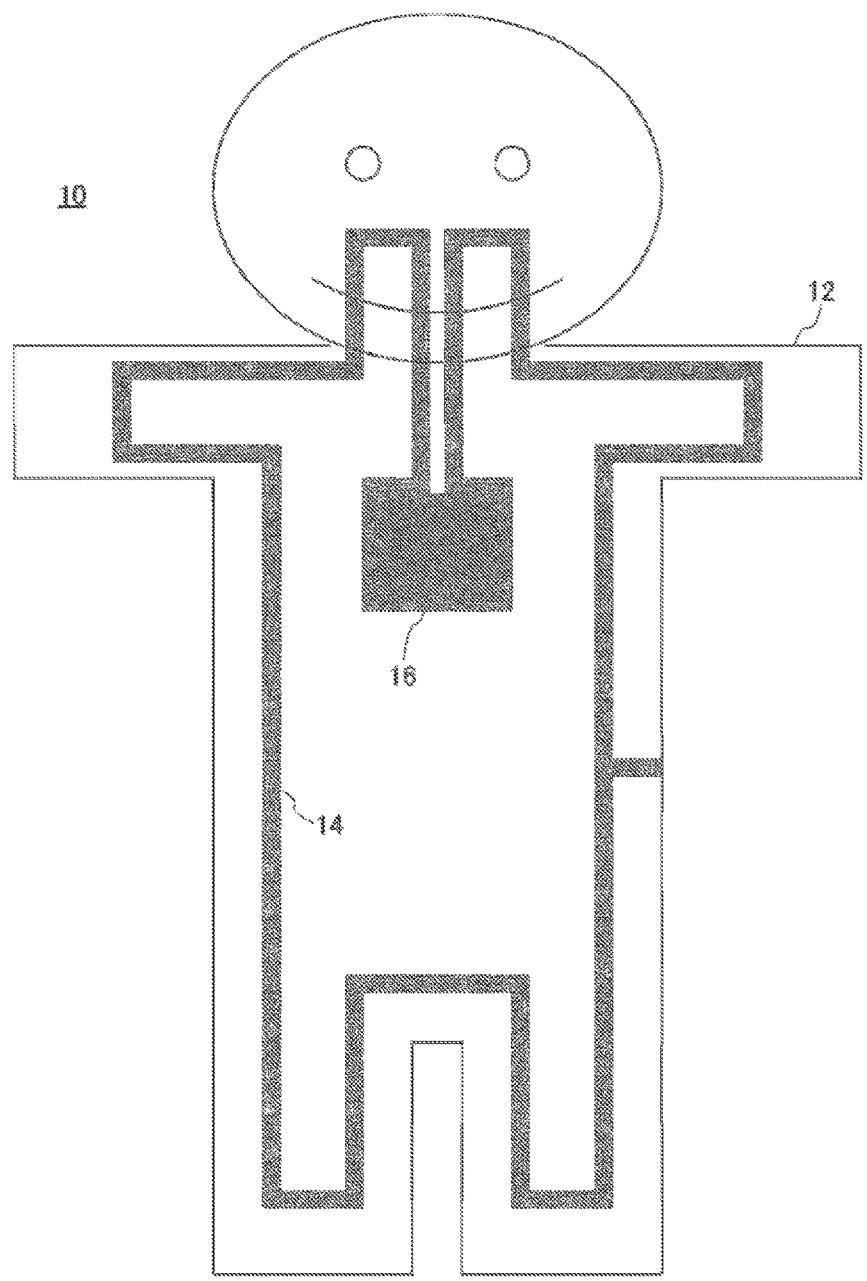
FIG. 1 is plan diagram of an example of a resin molded body with an RFIC package incorporated therein according to a preferred embodiment of the present invention.
Figure 2:
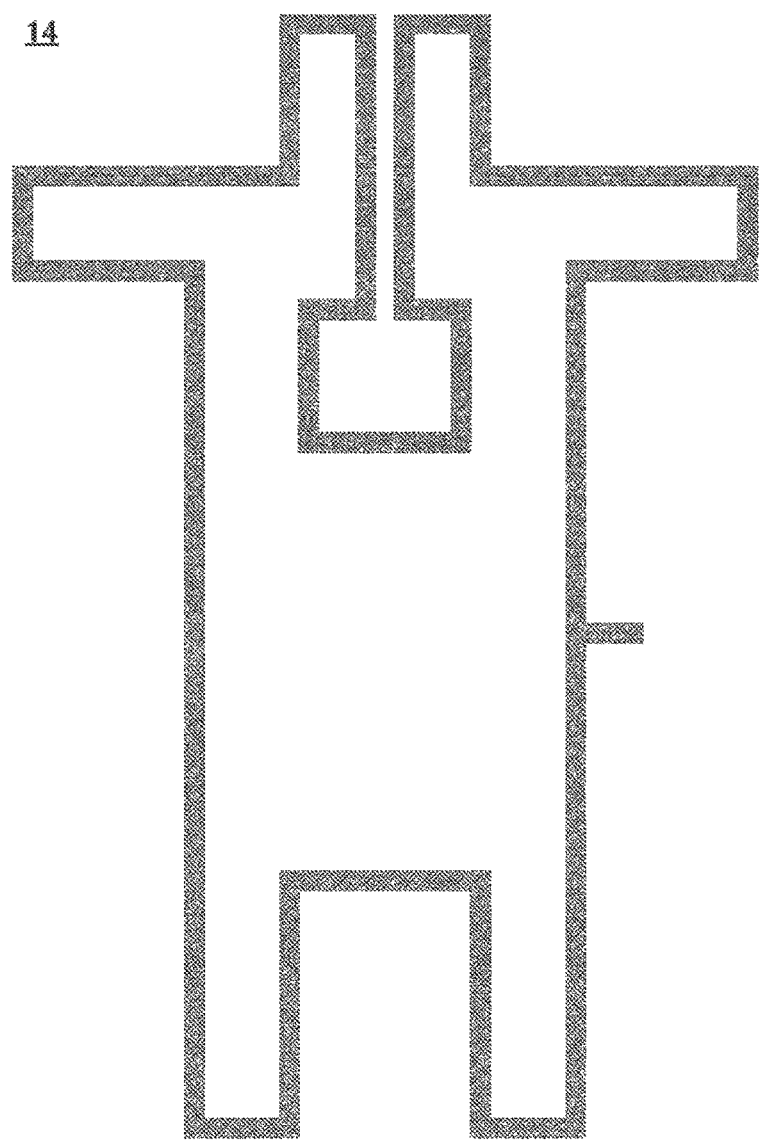
FIG. 2 is a plan diagram of a core material used in a preferred embodiment of the present invention.

With reference to FIG. 1, a resin molded body 10 with an RFIC package incorporated therein according to a preferred embodiment includes a resin molded body 12 that is insert-molded at a temperature equal to or higher than about 200° C., for example. The resin molded body 12 preferably defines a doll that includes a head portion, a torso portion, arm portions, and leg portions. A metal core material 14 preferably having a loop shape and an RFIC package 16 connected to the core material 14 are incorporated in the resin molded body 12.

An ABS-based resin with excellent heat-resistance and surface gloss is advantageously used as the resin of the resin molded body 12. Any arbitrary ABS-based resin such as that produced by bulk polymerization, that produced by emulsion polymerization, or that produced by suspension polymerization is usable as the ABS-based resin. Based on the property of the ABS-based resin, the surface gloss of the resin molded body 12 is improved by molding the resin molded body 12 at a relatively high temperature and quickly cooling the resin molded body 12.

The metal core material is used to attach the resin molded body, to secure the physical strength thereof and, when a movable portion is disposed, to secure the movability of the movable portion.

With reference to FIG. 2 and FIGS. 3A to 3C, the core material 14 preferably includes one single continuous line-shaped metal pattern and includes a large diameter loop portion 14*lg*, a slit portion (a first extension portion) 14*sl*1, and a small diameter portion 14*sm*.

The large diameter loop portion 14*lg* has an outer diameter dimension larger than the outer diameter dimension of the small diameter loop portion 14*sm*, and the small diameter loop portion 14*sm* is disposed on the inner side of the large diameter loop portion 14*lg*. The large diameter loop portion 14*lg* is buried in the doll to draw the body framework of the doll. Both ends of the large diameter loop portion 14*lg* are disposed in the head portion of the doll. The small diameter loop portion 14*sm* is buried in the chest portion of the doll in a posture that defines a C-shape or a substantial C-shape seen from the front of the doll, and with which the ends are disposed on the side of the head portion of the doll.

The slit portion 14*sl*1 includes line-shaped conductors LC1*a* and LC1*b* that extend to be in proximity to each other and to be in parallel or substantially in parallel to each other. The line-shaped conductor LC1*a* connects the one end of the small diameter loop portion 14*sm* and the one end of the large diameter loop portion 14*lg* to each other, and the line-shaped conductor LC1*b* connects the other end of the small diameter loop portion 14*sm* and the other end of the large diameter loop portion 14*lg* to each other.

Figure 4A:
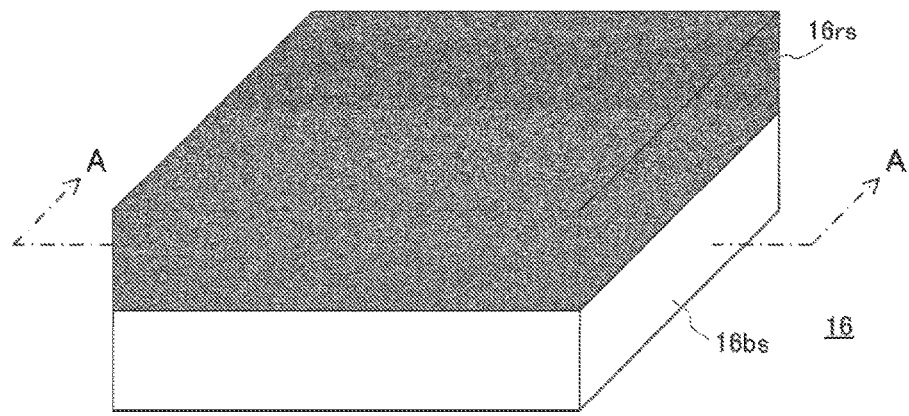
FIG. 4A is a perspective diagram of an RFIC chip according to a preferred embodiment of the present invention obliquely from above and FIG. 4B is a cross-sectional diagram of a cross section taken along A-A of the RFIC chip.
Figure 4B:
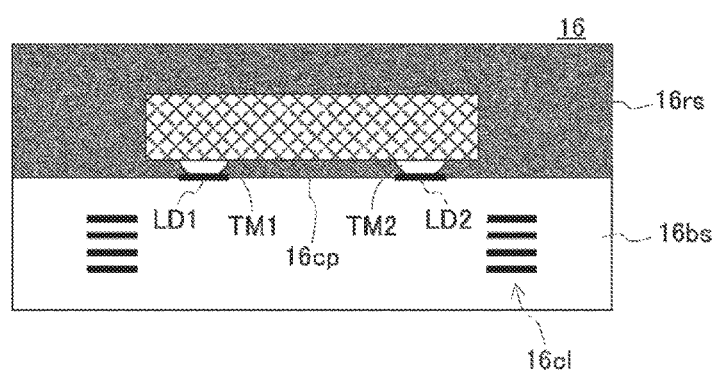

With reference to FIG. 4A and FIG. 4B, the RFIC package 16 preferably has a cuboid shape and includes a ceramic multi-layer substrate (a heat-resistant substrate) 16*bs* with a coil conductor 16*cl* incorporated therein, and an RFIC chip 16*cp* mounted on the mounting surface (the top surface) of the multi-layer substrate 16*bs* and connected to the coil conductor 16*cl*. In this case, the RFIC chip 16*cp* preferably is an IC chip for an HF band RFID system and uses a high frequency signal at 13.56 MHz as the communication frequency (a carrier frequency), for example.

The multi-layer substrate 16*bs* preferably is a heat-resistant substrate that has heat resistance against the heat during the insert-molding and, in this case, is a layered body formed preferably by stacking plural low temperature co-fired ceramics (LTCC) layers each having an insulation property on each other. The coil conductor 16*cl* is a layered coil including plural annular conductors connected to each other through interlayer connection conductors, includes a metal material including Ag, Cu, or the like as its main component, and is simultaneously fired as the LTCC. The RFIC chip 16*cp* is connected to a first and a second terminal electrodes disposed on the mounting surface of the multi-layer substrate 16*bs* by Ag nano-particle bonding or Au ultrasonic bonding, to be connected to the coil conductor 16*cl*.

For example, the RFIC chip 16*cp* may be a semiconductor element including a memory circuit and an RF circuit disposed on a silicon substrate and includes a first input and output terminal TM1 and a second input and output terminal TM 2 whose surfaces are each applied with a gold plating process. On the other hand, a first land (a first terminal electrode) LD1 connected to the one end of the coil conductor 16*cl* and a second land (a second terminal electrode) LD2 connected to the other end of the coil conductor 16*cl* are disposed on the mounting surface of the multi-layer substrate 16*bs*. The first land LD1 and the second land LD2 each include a metal material that includes Ag or Cu as its main component, are simultaneously fired with the LTCC, and each have the surface thereof applied with a gold plating process.

The first input and output terminal TM1 and a second input and output terminal TM 2 are respectively connected to the first land LD1 and the second land LD2 each by Ag nano-particle bonding or Au ultrasonic bonding. The first input and output terminal TM1 is thus integrated with the first land LD1 and the second input and output terminal TM 2 is thus integrated with the second land LD2. When the Ag nano-particle bonding is executed, Au and Ag are alloyed with each other in the bonding portion.

The heat resistance of the RFIC package 16 is improved and the RFIC package 16 is able to withstand up to the heatproof temperature of the RFIC chip 16*cp* because the multi-layer substrate 16*bs* includes the ceramic as its mother material and the RFIC chip 16*cp* is connected to the multi-layer substrate 16*bs* by the Ag nano-particle bonding or the Au ultrasonic bonding as above.

The RFIC chip 16*cp* is sealed by a sealing resin 16*rs* having high heat resistance such as an epoxy resin. The RFIC chip 16*cp* is thus mechanically protected or the handling performance of the RFIC package 16 is secured. The sealing resin 16*rs* is however not always necessary because the heat resistance of the RFIC chip 16*cp* itself is high.

With reference back to FIG. 1, the RFIC package 16 is disposed on the inner side of the small diameter loop portion 14*sm* of the core material 14. The small diameter loop portion 14*sm* extends along an outer edge of the RFIC package 16 that appears when the RFIC package 16 is seen from a direction of the winding axis of the coil conductor 16*cl*. The central axis of the coil conductor 16*cl* disposed in the RFIC package 16 matches with the central axis of the small diameter loop portion 14*sm*, and the diameter of the coil conductor 16*cl* is equal or substantially equal to the diameter of the small diameter loop portion 14*sm*. As a result, the coil conductor 16*cl* is bonded to the small diameter loop portion 14*sm* of the core material 14 through a magnetic field.

In this case, the core material 14 is connected to the RFIC package 16 not by any DC but by the magnetic field. The coil conductor is magnetic-field coupled to the small diameter loop portion of the core material. A signal current flowing from the RFIC chip to the coil conductor is thus led to a core wire as an induced current. Because the outer shape dimensions of the large diameter loop portion of the core material are larger than the outer shape dimensions of the coil conductor, the signal current travels for a long distance around in the large diameter loop portion of the core wire and, as a result, the communication distance is increased. Because the RFIC package is not directly connected to the core material through a conductive bonding material, the property is not significantly influenced even when the positional relation somewhat disperses between the coil conductor and the small diameter loop portion, and the connection reliability (especially, the reliability against the temperature and the flowing of the resin during the molding) is secured between the core material 14 and the RFIC package 16.

Because the slit portion 14*sl*1 is disposed, the density of the current flowing through the core material 14 is increased in the vicinity of the slit portion 14*sl*1 due to the magnetic-field coupling. A directive property is able to be imparted to the distribution of the magnetic flux generated in the core material by connecting the slit portion to the small diameter loop portion. A strong directive property is able to be imparted to the vicinity of the head portion by disposing the slit portion 14*sl*1 in the vicinity of the head portion of the doll and, in addition, by orienting the extension direction of the slit portion 14*sl*1 toward the head portion, as in this example.

Figure 5:
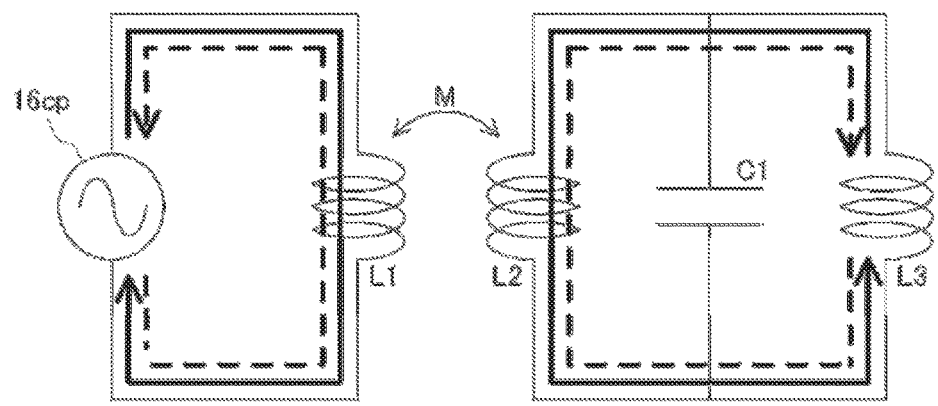
FIG. 5 is a graphical explanatory diagram of an example of an equivalent circuit according to a preferred embodiment of the present invention and paths of currents flowing therethrough.

FIG. 5 depicts an equivalent circuit of the resin molded body 10 with an RFIC package incorporated therein. The ends of the RFIC chip 16*cp* are connected to the ends of an inductor L1. The inductor L1 is coupled with an inductor L2 using a magnetic field coupling scheme. One end of the inductor L2 is connected to one end of a capacitor C1 and one end of an inductor L3, and the other end of the inductor L2 is connected to the other end of the capacitor C1 and the other end of the inductor L3. In this case, the inductor L1 is an inductance component of the coil conductor 16cl, the inductor L2 is an inductance component of the small diameter loop portion 14sm, and the inductor L3 is an inductance component of the large diameter loop portion 14lg. The capacitor C1 is mainly a capacitance component of the slit portion 14sl1.

The slit portion 14sl1 and the large diameter loop portion 14lg each define and function as a radiator by connecting the large diameter loop portion 14lg to the small diameter loop portion 14sm through the slit portion 14sl1 as above, and the communication distance is thus significantly extended. The directive property is able to be imparted to the distribution of the magnetic flux generated from the core material 14 because the density of the current flowing through the core material 14 is increased in the slit portion 14sl1 as above. The coil conductor 16cl and the small diameter loop portion 14sm present the positional relation and size relation as above, and the degree of the magnetic coupling is thus increased between the RFIC chip 16cp and the small diameter loop portion 14sm. The communication distance is also thus extended.

Figure 6:
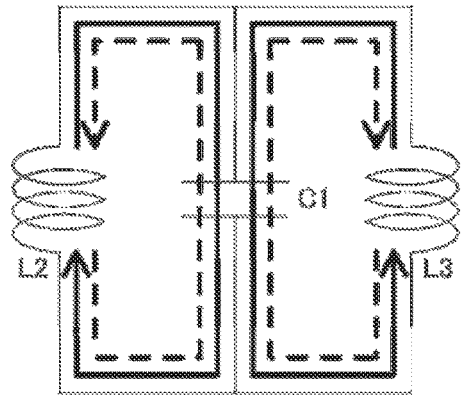
FIG. 6 is a graphical explanatory diagram of another example of a portion of an equivalent circuit according to a preferred embodiment of the present invention and the paths of the currents flowing therethrough.

When the resonance frequency of a second resonance circuit including the inductors L2 and L3 and the capacitor C1 significantly differs from the resonance frequency generated by a first resonance circuit including the capacitor component retained by the RFIC chip 16cp itself and the inductor L1 (for example, one of the resonance frequencies is equal to or higher than a double of the other), an AC flows in each of the resonance circuits in the manner indicated by solid or dotted line arrows. In this case, the capacitor C1 acts as a floating capacitance. In contrast, when the resonance frequency of the second resonance circuit is in a frequency range close to the resonance frequency of the first resonance circuit (for example, ±1 MHz or smaller relative to the resonance frequency of 13.56 MHz of the first resonance circuit), an AC flows in the second resonance circuit in the manner indicated by a solid or a dotted line in FIG. 6. The communication distance is further extended when the resonance frequency of the LC parallel circuit is adjusted to be 13.56 MHz. Preferably, the resonance frequencies of the first resonance circuit and the second resonance circuit are equal or substantially equal to each other. Each of the resonance circuits may include other inductors and capacitors further added thereto for the adjustment of the resonance frequency, and the like.

The resin molded body 10 with an RFIC package incorporated therein preferably is manufactured in the manner described below. Plural core materials 14, 14, . . . are produced by executing a punching process for a hoop material HP1 that includes a metal material such as stainless steel (see FIG. 7). The resulting plural core materials 14, 14, . . . are held through connection portions CN1, CN1, . . . by a runner portion RN1 remaining after the punching process.

Figure 8:
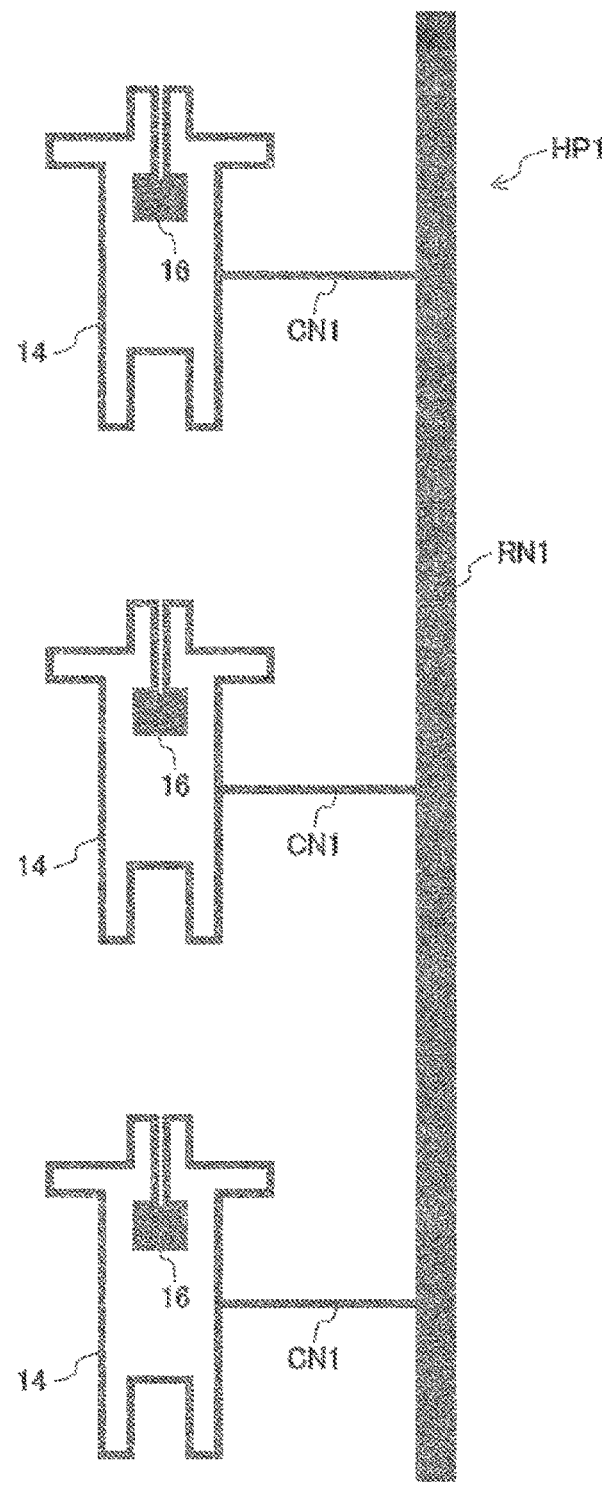
FIG. 8 is a graphical explanatory diagram of another portion of a manufacturing process of a resin molded body with an RFIC package incorporated therein according to a preferred embodiment of the present invention.

The RFIC package 16 is attached on the inner side of the small diameter loop portion 14sm of each of the core materials 14, 14, . . . (see FIG. 8).

Figure 9:
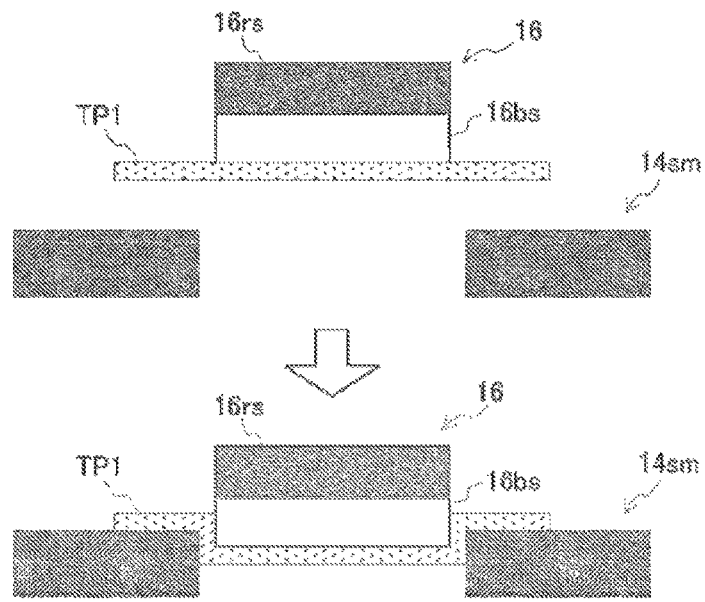
FIG. 9 is a graphical explanatory diagram of an example of a step of attaching the RFIC package to the core material.

For example, a double-sided adhesive tape TP1 having a diameter larger than the diameter of the small diameter loop portion 14sm is prepared and the lower surface of the RFIC package 16 is caused to adhere to the double-sided adhesive tape TP1 at the center of the top surface thereof (see the upper portion of FIG. 9). The vicinity of the end of the lower surface of the double-sided adhesive tape TP1 is caused to adhere to the top surface of the small diameter loop portion 14sm (see the lower portion of FIG. 9).

Figure 10:
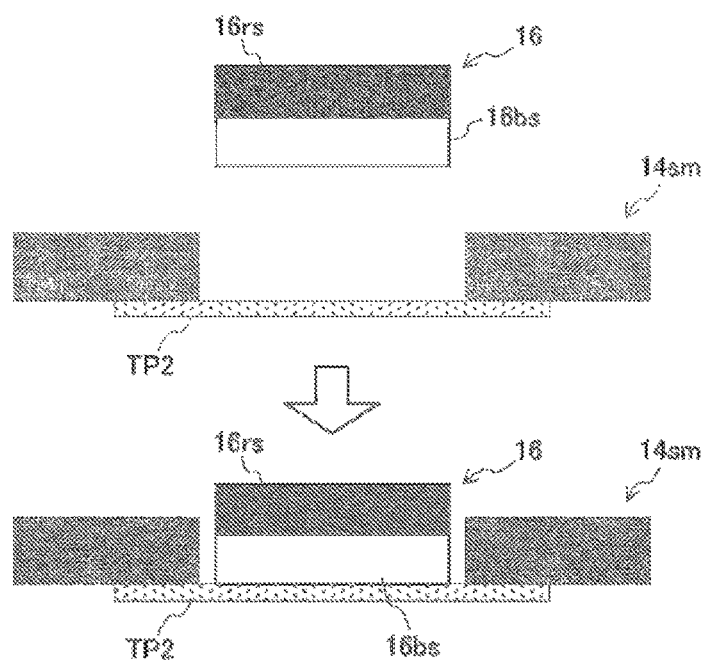
FIG. 10 is a graphical explanatory diagram of another example of the step of attaching the RFIC package to the core material.

Otherwise, a single-sided adhesive tape TP2 having a diameter larger than the diameter of the small diameter loop portion 14sm is prepared and the vicinity of the end of the top surface of the single-sided adhesive tape TP2 is caused to adhere to the lower surface of the small diameter loop portion 14sm (see the upper portion of FIG. 10). The lower surface of the RFIC package 16 is caused to adhere to the top surface of the single-sided adhesive tape TP2 at the center thereof (see the lower portion of FIG. 10).

Figure 11:
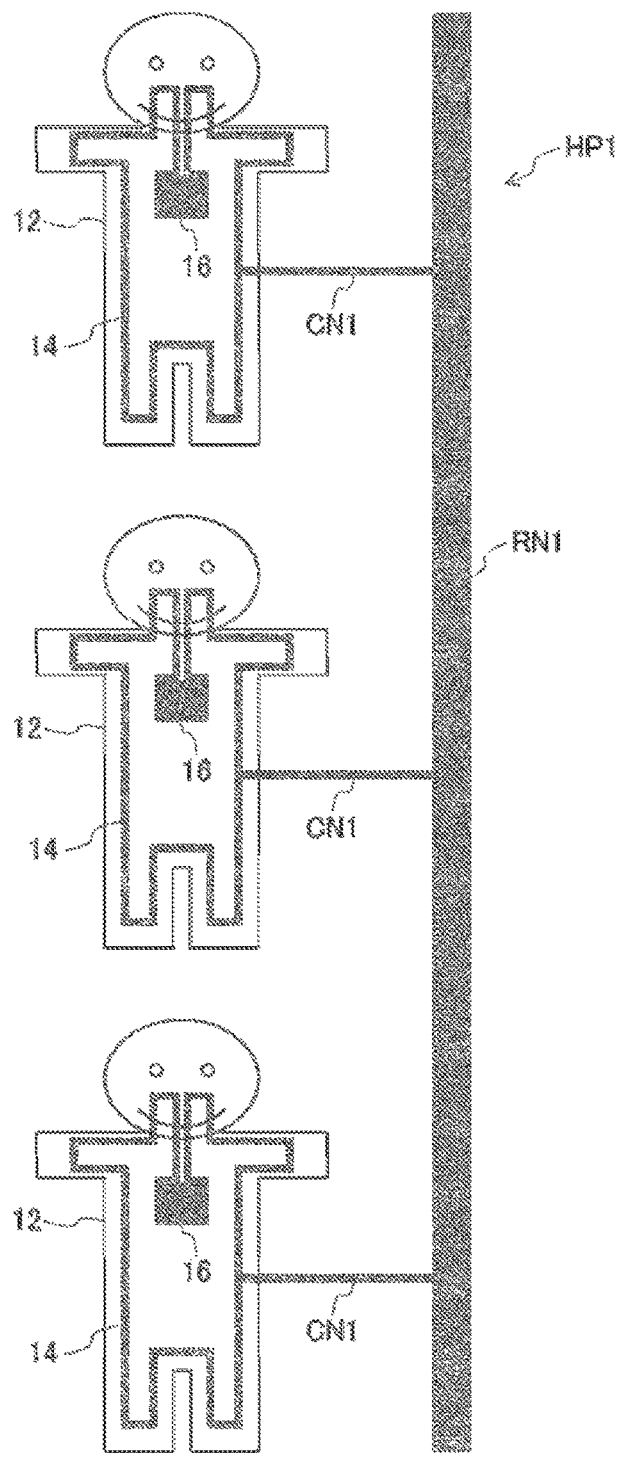
FIG. 11 is a graphical explanatory diagram of yet another portion of a manufacturing process of the resin molded body with an RFIC package incorporated according to a preferred embodiment of the present invention.
Figure 12:
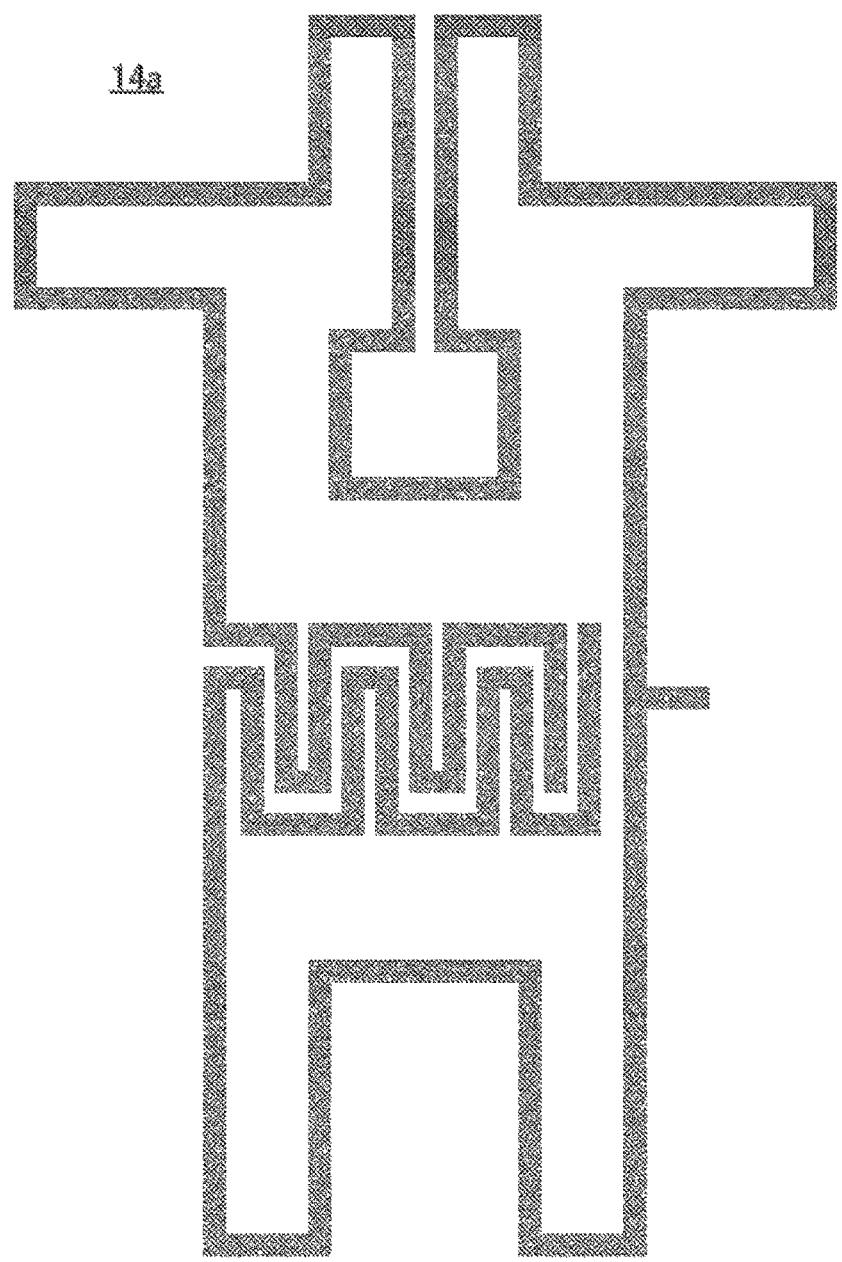
FIG. 12 is a plan diagram of an example of a core material and an RFIC package that are applied to another preferred embodiment of the present invention.
Figure 13A:
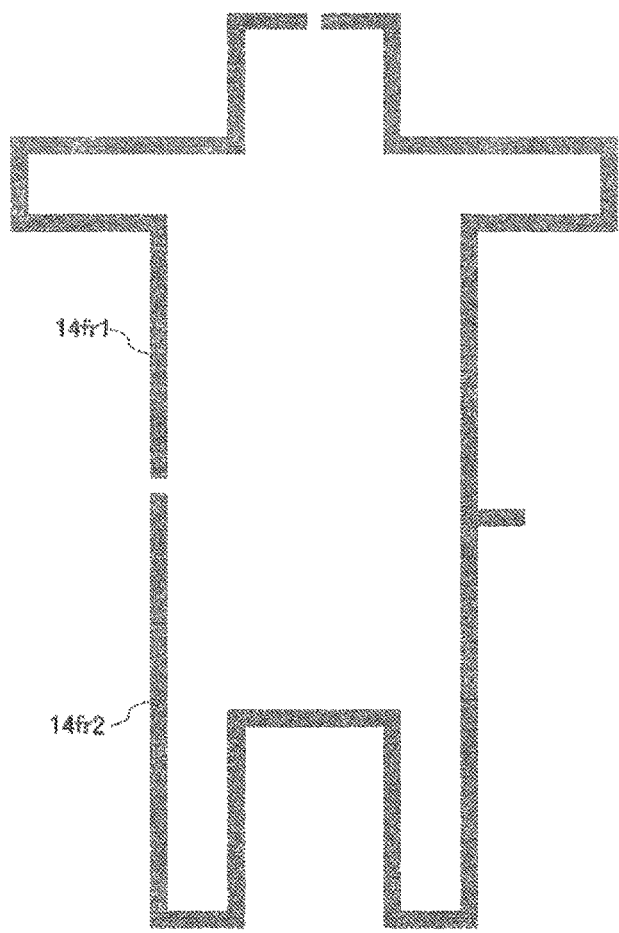
FIG. 13A is a plan diagram of a large diameter loop portion of the core material.
Figure 13B:
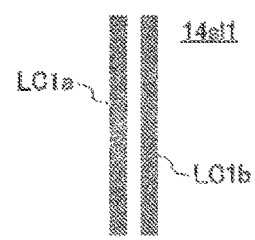
FIG. 13B is a plan diagram of a slit portion of the core material, FIG. 13C thereof is a plan diagram of a small diameter loop portion of the core material, and FIG. 13D thereof is a plan diagram of a capacitance generating portion of the core material.
Figure 13C:
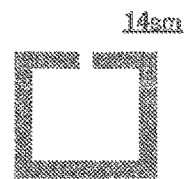
Figure 13D:
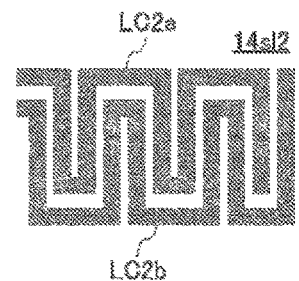

When the RFIC package 16 is attached to the core material 14 as above, the resin molded body 12 is produced by insert-molding at a temperature equal to or higher than about 200° C. (see FIG. 11). The double-sided adhesive tape TP1 or the single-sided adhesive tape TP2 disappears due to the high temperature during the insert-molding. The connection portions CN1 and the runner portion RN1 of the hoop material HP1 define and function as heat dissipation materials that are used when the resin molded body 12 is cooled, and the surface gloss of the resin molded body 12 is thus improved. After the cooling, when the core materials 14, 14, . . . are cut off from the connection portions CN1 of the hoop material HP1, the plural resin molded bodies 10, 10, . . . each with the RFIC package incorporated therein are acquired.

Figure 7:
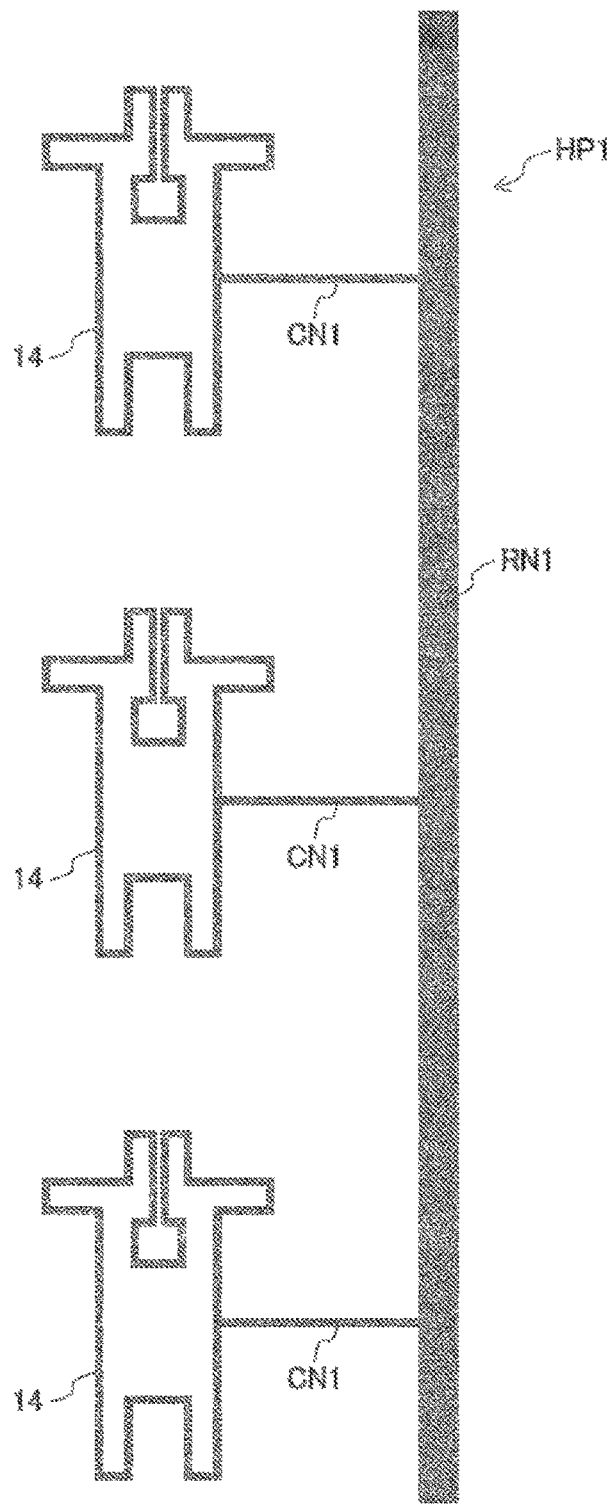
FIG. 7 is a graphical explanatory diagram of a portion of a manufacturing process of a resin molded body with an RFIC package incorporated therein according to a preferred embodiment of the present invention.

According to FIG. 7, the core materials 14 are produced by the punching process executed for the hoop material HP1. The core materials 14 may however be produced by bending work and a welding process of a metal wire rod.

As can be seen from the above description, the resin molded body 10 with an RFIC package incorporated therein is manufactured by executing insert-molding in the state where the metal core material 14 and the RFIC package 16 connected to the metal core material 14 are incorporated therein. The RFIC package 16 includes the ceramic multi-layer substrate 16bs incorporating the coil conductor 16cl therein, and the RFIC chip 16cp mounted on the multi-layer substrate 16bs. The RFIC chip 16cp is connected to the coil conductor 16cl preferably by the Ag nano-particle bonding or the Au ultrasonic bonding. The coil conductor 16cl is coupled with the core material 14 using the magnetic field coupling scheme The insert-molding is executed at a high temperature equal to or higher than about 200° C. or at a further high temperature equal to or higher than about 250° C. and the resin flows due to the molding while the coil conductor 16cl is incorporated in the ceramic multi-layer substrate 16bs, the RFIC chip 16cp is connected to the coil conductor 16cl by the nano-particle coupling or the ultrasonic bonding, and the coil conductor 16cl is coupled with the core material 14 using the magnetic field coupling scheme. The reliability is thus maintained for each of the electric connection between the RFIC chip 16cp and the coil conductor 16cl, and the magnetic connection between the coil conductor 16cl and the core material 14.

With reference to FIG. 12 and FIG. 13A to FIG. 13D, in another preferred embodiment of the present invention, a core material 14a is preferably used instead of the core material 14. The core material 14a includes a first body framework portion 14fr1, a second body framework portion 14fr2, a slit portion (a first extension portion) 14sl1, the small diameter loop portion 14sm, and a slit portion (a second extension portion) 14sl2.

Figure 3A:
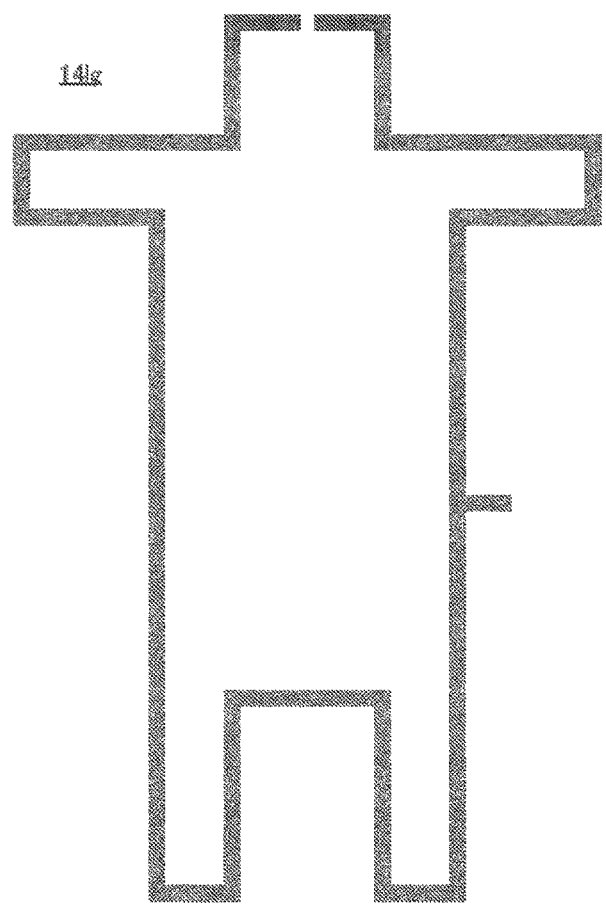
FIG. 3A is a plan diagram of a large diameter loop portion of the core material.
Figure 3B:
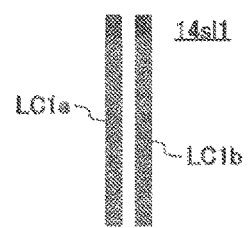
FIG. 3B is a plan diagram of a slit portion of the core material, and FIG. 3C thereof is a plan diagram of a small diameter loop portion of the core material.
Figure 3C:
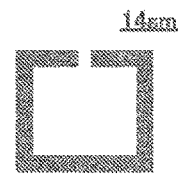

The first body framework portion 14fr1 and the second body framework portion 14fr2 match with a component defined by disposing a cutout in a portion of the large diameter loop portion 14lg depicted in FIG. 3A. The portion extending from the one end of the large diameter loop portion 14*lg* to the cutout corresponds to the first body framework portion 14*fr*1, and the portion extending from the other end of the large diameter loop portion 14*lg* to the cutout corresponds to the second body framework portion 14*fr*2.

The slit portion 14*sl*2 includes line-shaped conductors LC2*a* and LC2*b* that meander to be in proximity to each other. One end of the line-shaped conductor LC2*a* is connected to the end on the side of the cutout of the first body framework portion 14*fr*1, and the other end of the line-shaped conductor LC2*a* is an open end. One end of the line-shaped conductor LC2*b* is connected to the end on the side of the cutout of the second body framework portion 14*fr*2, and the other end of the line-shaped conductor LC2*b* is an open end.

Figure 14:
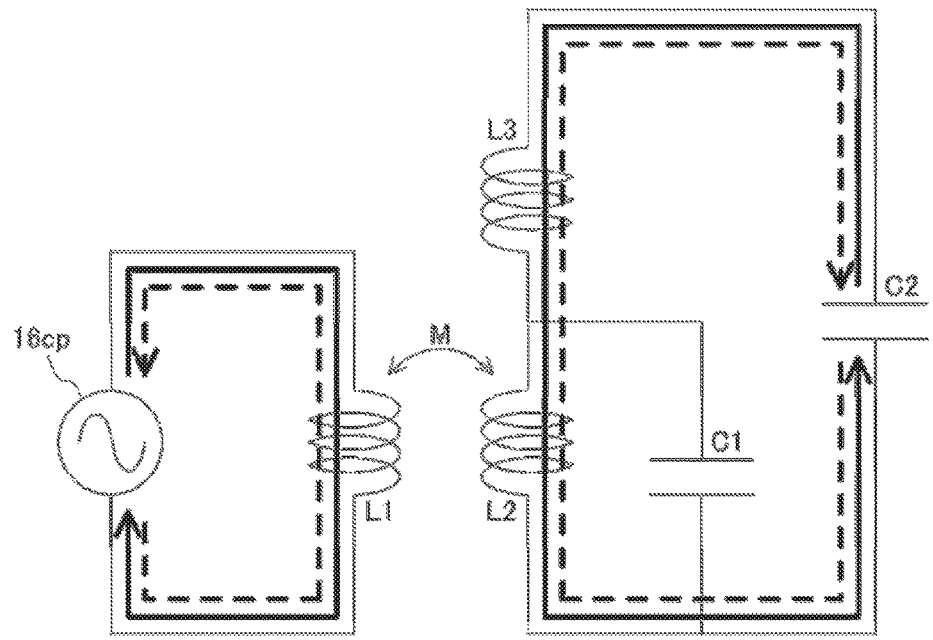
FIG. 14 is a graphical explanatory diagram of an example of an equivalent circuit of another preferred embodiment of the present invention and paths of currents flowing therethrough.

When the core material 14*a* is used, an equivalent circuit of the resin molded body 10 with an RFIC package incorporated therein is configured as depicted in FIG. 14.

The one end of the inductor L2 coupled with the inductor L1 in the magnetic field coupling scheme is connected with the one end of the inductor L3 and the one end of the capacitor C1. The other end of the inductor L3 is connected to one end of a capacitor C2 and another end of the capacitor C2 is connected to the other end of the capacitor C1 and the other end of the inductor L2.

In this case, the inductor L2 is an inductance component of the small diameter loop portion 14*sm* and the inductor L3 is an inductance component of the second body framework portion 14*fr*2. The capacitor C1 is a capacitance component of the slit portion 14*sl*1 and the capacitor C2 is a capacitance component of the slit portion 14*sl*2. The capacitance of the capacitor C2 is adjusted such that a circuit including the inductors L1 and L2, and the capacitors C1 and C2 resonates at 13.56 MHz. As a result, an AC flows through this circuit in the manner indicated by solid or dotted line arrows and the communication distance is extended farther. The capacitor C1 is floating capacitance.

Preferred embodiments of the present invention are applicable to an HF-band RFID system and to a UHF-band RFID system.

Figure 15:
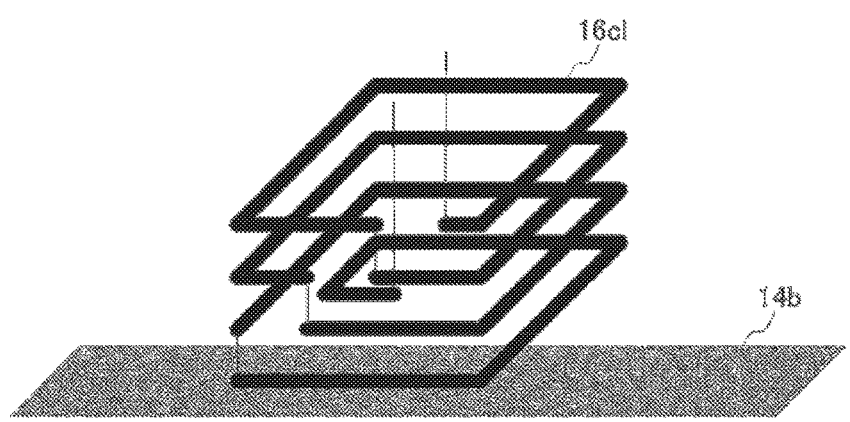
FIG. 15 is a graphical explanatory diagram of an example of a positional relation between a coil conductor and a core material of another preferred embodiment of the present invention.
Figure 16:
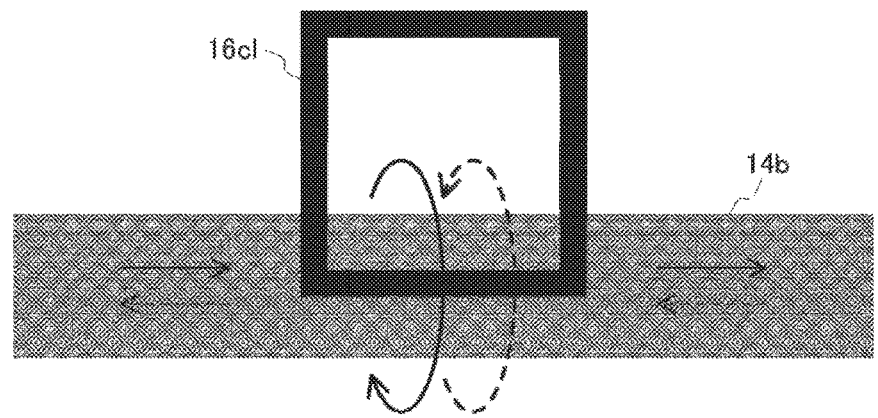
FIG. 16 is a graphical explanatory diagram of an example of the state of magnetic field coupling between the coil conductor and the core material of another preferred embodiment of the present invention.
Figure 17:
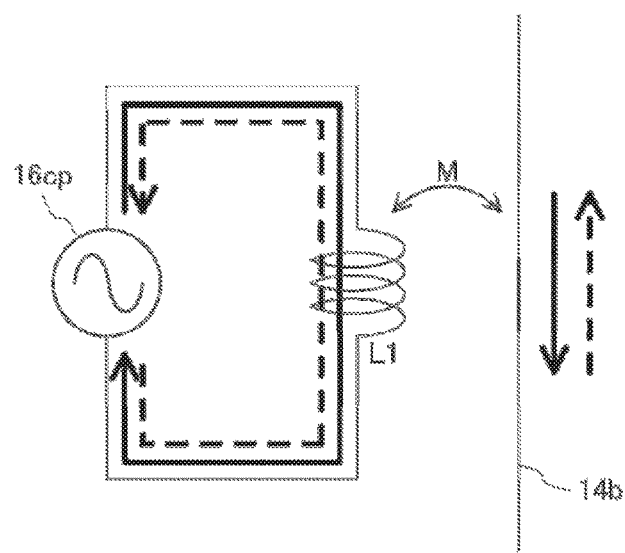
FIG. 17 is a graphical explanatory diagram of an example of an equivalent circuit of another preferred embodiment of the present invention and paths of currents flowing therethrough.

With reference to FIG. 15 and FIG. 16, in another preferred embodiment of the present invention, when the RFIC chip 16*cp* uses a high frequency signal in the UHF band (for example, a 900-MHz band) as its communication frequency band, a core material 14*b* is used instead of the core material 14. The core material 14*b* preferably has a belt shape with its ends open. The RFIC package 16 is attached onto the core material 14*b* such that a portion of the coil conductor 16*cl* overlaps with the core material 14*b* in a planar view (for example, such that a side of a rectangular ring drawn by the coil conductor 16*cl* extends in the center in the width direction of the core material 14*b* in the planar view). In this case, an equivalent circuit of the resin molded body 10 with an RFIC package incorporated therein is configured as depicted in FIG. 17. In this preferred embodiment, the core material 14*b* defines and functions as an antenna and the high frequency signal output from the RFIC chip 16*cp* is radiated from the core material 14*b*.

Figure 18:
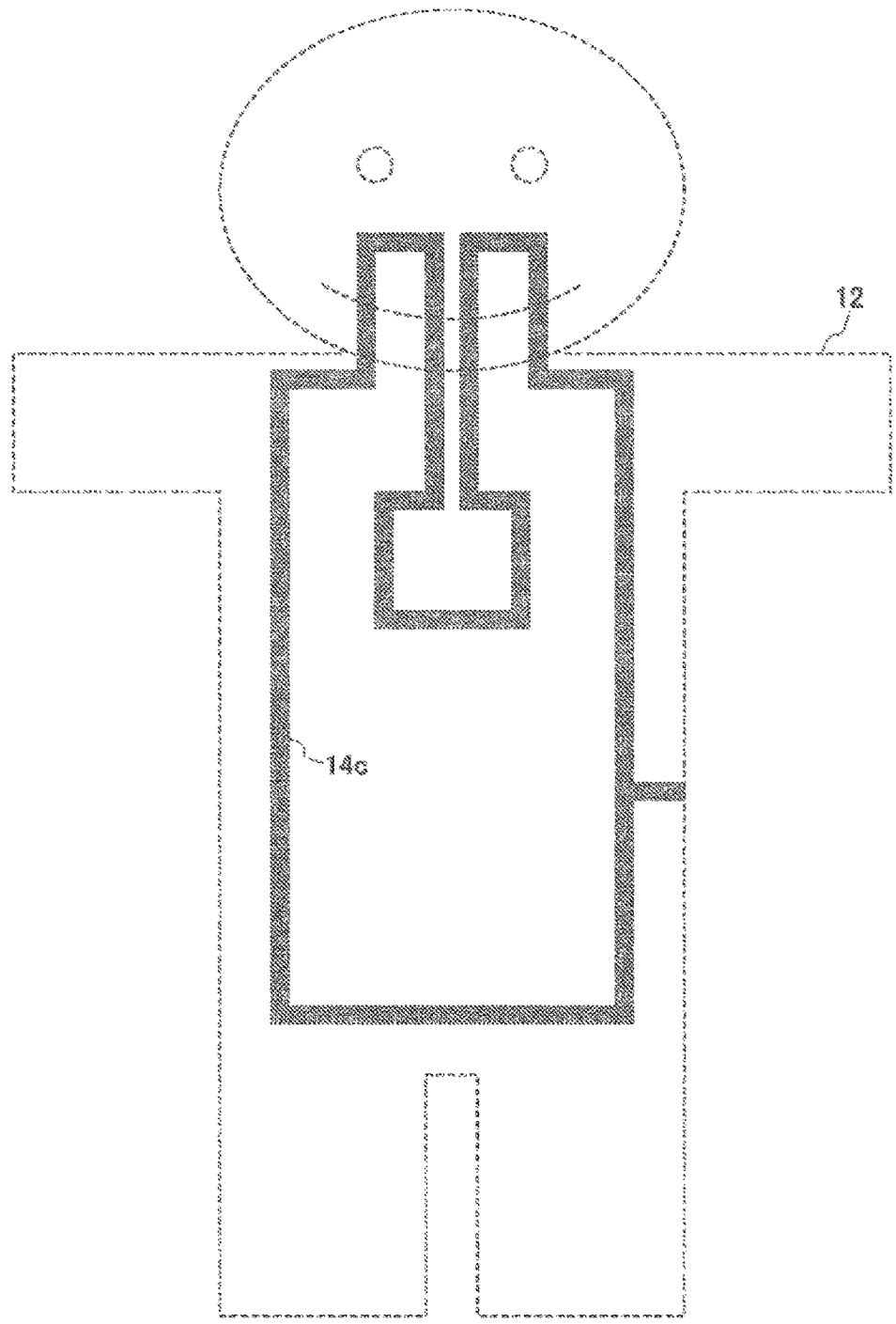
FIG. 18 is a plan diagram of a core material that is applied to yet another preferred embodiment of the present invention.
Figure 19:
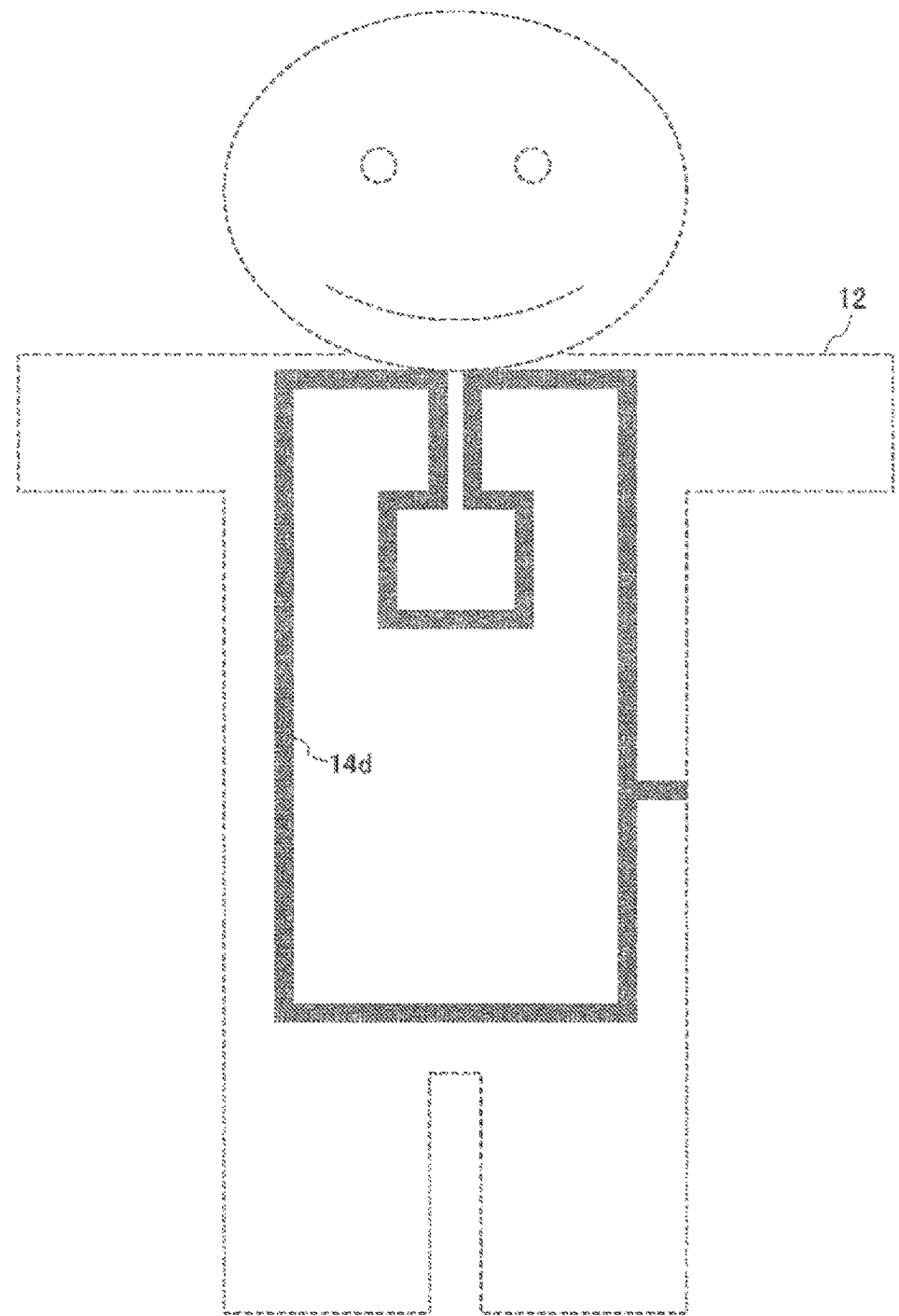
FIG. 19 is a plan diagram of a core material that is applied to another preferred embodiment of the present invention.

According to the resin molded body 10 with an RFIC package incorporated therein depicted in FIG. 1, the core material 14 is buried in the doll such that a portion of the large diameter loop portion 14*lg* extends along the arm portions, the torso portion, and leg portions of the doll and another portion of the large diameter loop portion 14*lg* reaches the head portion of the doll. As depicted in FIG. 18, however, such a core material 14*c* may be buried in the doll, such that a portion of the large diameter loop portion extends along only the torso portion of the doll and another portion of the large diameter loop portion reaching the head portion of the doll. As depicted in FIG. 19, such a core material 14*d* may be buried in the doll, as that having the large diameter loop portion extending along only the torso portion of the doll.

The shape of the outer appearance of the resin molded body is not limited to the doll shape. For example, the shape may be a shape of an animal or may be a shape of an automobile or an airplane. The metal core material only has to be a metal core material whose at least one portion is buried in the resin molded body, and may be molded into an arbitrary shape.

The resin for the molding is not limited to the ABS resin and each of various types of thermosetting resin and thermoplastic resin is usable.

The RFIC package is not limited to any RFIC package that is formed by mounting the RFIC chip on the surface of the ceramic substrate incorporating therein the coil conductor and sealing the RFIC chip using the resin. For example, an RFIC package may be formed by burying an RFIC chip in a heat-resistant resin substrate incorporating therein a coil conductor. In this case, preferably, a bonding form excellent in the heat resistance such as the Ag nano-particle bonding or the Au ultrasonic bonding is also used for the connection portion between the coil conductor and the RFIC chip. The overall RFIC package does not need to always be incorporated in the resin molded body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin molded body comprising:
   a resin molded body that is insert-molded;
   a metal core material that is embedded in the resin molded body; and
   an RFIC package that is embedded in the resin molded body and connected to the metal core material; wherein
   the metal core material includes a body framework of the resin molded body;
   the RFIC package includes:
      a coil conductor being embedded in a heat resistant substrate;
      an RFIC chip disposed on the heat-resistant substrate; and
      a sealing resin that seals the RFIC chip; wherein
         the sealing resin and the resin molded body are different materials; and
         the coil conductor is connected to the metal core material through magnetic-field coupling; and
      the metal core material including the body framework is provided externally to the RFIC package.

2. The resin molded body according to claim 1, wherein the core material includes a small diameter loop portion that has a C-shape or a substantial C-shape in a portion thereof; and
   the coil conductor is connected to the small diameter loop portion through the magnetic-field coupling.

3. The resin molded body according to claim 2, wherein the core material further comprises first extension portions that extend from ends of the small diameter loop portion to be in proximity to each other and to be in parallel or substantially in parallel to each other.

4. The resin molded body according to claim 3, wherein
the resin molded body defines a doll; and
the first extension portions are disposed in a vicinity of or adjacent to a head portion of the doll.

5. The resin molded body according to claim 2, wherein the body framework comprises a first body framework portion including one end connected to one end of the small diameter loop portion and a second body framework portion including one end connected to another end of the small diameter loop portion, and the core material further comprises second extension portions that extend from another end of the first body framework portion and another end of the second body framework portion to be in proximity to or adjacent to each other and to be in parallel or substantially in parallel to each other.

6. The resin molded body according to claim 5, wherein
the second extension portions, together with the small diameter loop portion, the first body framework portion, and the second body framework portion, define a resonance circuit; and
a resonance frequency of the resonance circuit is matched with a frequency band of a high frequency signal output from the RFIC chip.

7. The resin molded body according to claim 1, wherein the RFIC chip is mounted on a surface of the heat-resistant substrate by Ag nano-particle bonding or Au ultrasonic bonding to be connected to the coil conductor.

8. The resin molded body according to claim 7, wherein the RFIC chip comprises a first input and output terminal, and a second input and output terminal including at least surfaces that include a metal material including Au as a main component thereof;
a first end and a second end of the coil conductor are connected to a first terminal electrode and a second terminal electrode that are disposed on a mounting surface of the heat-resistant substrate and include at least surfaces that include a metal material including Au as a main component thereof; and
the first input and output terminal and the second input and output terminal are respectively connected to the first terminal electrode and the second terminal electrode by the Ag nano-particle bonding or the Au ultrasonic bonding.

9. The resin molded body according to claim 1, wherein the core material includes a small diameter loop portion, a large diameter loop portion with an outer dimension larger than that of the small diameter portion, and a slit portion.

10. The resin molded body according to claim 9, wherein the slit portion includes line-shaped conductors extending in parallel or substantially in parallel to each other.

11. The resin molded body according to claim 1, wherein
the resin molded body includes an ABS-based resin; and
the insert-molding is executed at a temperature equal to or higher than about 200° C.

12. The resin molded body according to claim 1, wherein the core material includes a single continuous line-shaped metal pattern.

13. The resin molded body according to claim 1, wherein the heat resistant substrate is a ceramic multilayer substrate.

14. The resin molded body according to claim 1, wherein the RFIC chip is an IC chip used in an HF band RFID system or a UHF-band system.

15. The resin molded body according to claim 1, wherein the metal core material is belt-shaped and includes open ends.

16. The resin molded body according to claim 1, wherein the resin molded body has a shape that defines one of a doll, an animal, an automobile and a plane.

17. The resin molded body according to claim 1, wherein the resin molded body includes one of an ABS-based resin, a thermosetting resin and a thermoplastic resin.

* * * * *